United States Patent
Figueroa et al.

(10) Patent No.: US 6,483,692 B2
(45) Date of Patent: Nov. 19, 2002

(54) CAPACITOR WITH EXTENDED SURFACE LANDS AND METHOD OF FABRICATION THEREFOR

(75) Inventors: David G. Figueroa, Mesa; Huong T. Do, Scottsdale; Jorge Pedro Rodriguez, Chandler; Michael Walk, Mesa, all of AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/741,302

(22) Filed: Dec. 19, 2000

(65) Prior Publication Data

US 2002/0075630 A1 Jun. 20, 2002

(51) Int. Cl.[7] ................................................. H01G 2/20
(52) U.S. Cl. .................. 361/308.1; 361/309; 361/306.3
(58) Field of Search ........................... 361/306.1, 306.2, 361/306.3, 307, 308.1, 309, 310, 321.2, 320

(56) References Cited

U.S. PATENT DOCUMENTS

| | | | | |
|---|---|---|---|---|
| 4,590,537 A | * | 5/1986 | Sakamoto | 361/306.3 |
| 5,345,361 A | * | 9/1994 | Billotte et al. | 29/25.03 |
| 5,347,423 A | * | 9/1994 | deNeuf et al. | 29/25.42 |
| 5,817,543 A | | 10/1998 | McAllister et al. | 438/109 |
| 5,895,966 A | | 4/1999 | Penchuk | 257/690 |
| 6,191,932 B1 | * | 2/2001 | Kuroda et al. | 361/303 |

FOREIGN PATENT DOCUMENTS

| | | | | |
|---|---|---|---|---|
| EP | 0335358 | 10/1989 | | H01G/1/147 |
| FR | 2622346 | 4/1989 | | H01G/1/35 |
| JP | 06-349678 | 12/1994 | | H01G/4/42 |

* cited by examiner

Primary Examiner—Anthony Dinkins
(74) Attorney, Agent, or Firm—Schwegman, Lundberg, Woessner & Kluth, P.A.

(57) ABSTRACT

A capacitor (FIGS. 6–9) includes one or more extended surface lands (604, 704, 804, 904, FIGS. 6–9). In one embodiment, each extended surface land is a land on a top or bottom surface of the capacitor, having a land length that is equal to at least 30% of the width (614, FIG. 6) of the capacitor or 20% of the length (914, FIG. 9) of the capacitor. When embedded within an integrated circuit package (1102, FIG. 11), two or more vias (1112) can be electrically connected to the extended surface lands (1108).

29 Claims, 9 Drawing Sheets

US 6,483,692 B2

CAPACITOR WITH EXTENDED SURFACE LANDS AND METHOD OF FABRICATION THEREFOR

TECHNICAL FIELD OF THE INVENTION

The present invention relates generally to discrete capacitors, and more particularly, to surface lands on the surfaces of discrete capacitors, and methods of capacitor fabrication.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. To reduce such noise, capacitors known as decoupling capacitors are often used to provide a stable signal or stable supply of power to the circuitry. Capacitors are farther utilized to dampen voltage overshoot when an electronic device (e.g., a processor) is powered down, and to dampen voltage droop when the device powers up.

Decoupling capacitors and capacitors for dampening voltage overshoot or droop are generally placed as close as practical to a die load in order to increase the capacitors' effectiveness. Often, the capacitors are surface mounted to the die side or land side of the package upon which the die is mounted. FIG. 1 illustrates a cross-section of an integrated circuit package 102 having die side capacitors 106 and land side capacitors 108 in accordance with the prior art. Die side capacitors 106 are mounted on the same side of the package as the integrated circuit die 104. In contrast, land side capacitors 108 are mounted on the opposite side of the package 102 as the die 104.

FIG. 2 illustrates an electrical circuit that simulates the electrical characteristics of the capacitors illustrated in FIG. 1. The circuit shows a die load 202, which may require capacitance or noise dampening in order to function properly. Some of the capacitance can be supplied by capacitance, as modeled by capacitor 204, located on the die. Other capacitance, however, must be provided off chip, as indicated by off-chip capacitor 206. The off-chip capacitor 206 could be, for example, the die side capacitors 106 and/or land side capacitors 108 illustrated in FIG. 1.

Naturally, off-chip capacitor 206 would be located some distance, however small, from die load 202, due to manufacturing constraints. Accordingly, some inductance, as modeled by inductor 208, exists between the die load and the off-chip capacitor 206. The value of the inductor 208 is related to the "loop area," which is the electrical distance from die load 202, through capacitor 206, and back to die load 202. Because inductor 208 tends to slow the response time of off-chip capacitor 206, it is desirable to minimize the loop area, thus reducing the value of inductor 208.

Referring back to FIG. 1, die side capacitors 106 are typically mounted around the perimeter of die 104, and provide capacitance to various points on the die through traces, vias, and planes (not shown) in the package 102. Because die side capacitors 106 are mounted around the perimeter, the path length between a die load and capacitor 106 may result in a relatively high inductance feature between the die load and capacitor 106.

In contrast, land side capacitors 108 can be mounted directly below die 104, and thus directly below some die loads. However, the package also includes land side connectors (not shown), such as pins or lands. In some cases, placement of capacitors 108 on the package's land side would interfere with these connectors. Thus, the use of land side capacitors 108 is not always an acceptable solution to the inductance problem.

FIG. 3 illustrates a top view of an eight contact discrete capacitor 300, which can be used as a decoupling capacitor or to dampen voltage overshoot or droop, in accordance with the prior art. Contacts 302 provide electrical connections to electrodes of an internal capacitor structure within capacitor 300. Going clockwise from the upper left contact 302, the polarities of contacts 302 alternate between positive and negative. This results in opposing contacts (i.e., contacts directly opposite each other) having opposite polarities. Each contact 302 includes surface lands 304 on the top surface 308 and bottom surface of capacitor 300.

Referring also to FIG. 4, which illustrates a side view of a discrete capacitor in accordance with the prior art, each top and bottom land pair is electrically connected through a side termination 402 on the side surface 404 of the capacitor. Inner electrodes (not shown) electrically connect with the side terminations 402, and thus with the surface lands 304.

The length of lands 304 is indicated by dimension 312. Generally, the land length is designed to be a length that allows a reliable, surface mount solder attachment. A ratio of the length 312 of surface lands 304 to the width 310 of capacitor 300 is typically about the same for most devices. For example, a capacitor having a width 310 of 1.3 millimeters (mm) would typically have lands 304 with lengths 312 of about 0.3 mm, which is approximately 23% of the width 310 of capacitor 300.

Capacitors sometimes have more or fewer contacts, as well. For example, FIG. 5 illustrates a top view of a ten contact discrete capacitor 500 in accordance with the prior art. Eight of contacts 502 contact the sides of capacitor 500, and are referred to herein as "side contacts." Two of contacts 504 contact the ends of capacitor 500, and are referred to herein as "end contacts." Going clockwise from the upper left contact 502, the polarities of contacts 502, 504 alternate between positive and negative. Unlike the capacitor illustrated in FIG. 3, this results in opposing side contacts 502 having the same polarities, while end contacts 504 have opposite polarities.

The lengths of the side and end contact surface lands are represented by dimensions 512 and 514, respectively. As with the capacitor 300 illustrated in FIG. 3, the ratio of the length 512 of the side contact surface lands to the width 510 of capacitor 500 is typically about the same (e.g., about 23%) for most capacitors. In addition, the ratio of the length 514 of the end contact surface lands to the length 516 of capacitor 500 is also typically about the same. For example, a capacitor having a length 516 of 2.0 mm would typically have end contact lands with lengths 514 of about 0.3 mm, which is approximately 15% of the length 516 of capacitor 500.

As electronic devices continue to advance, an increasing need exists for higher capacitance with reduced inductance for decoupling, voltage dampening, and supplying charge. In addition, a need exists for capacitance solutions that do not interfere with package connectors, and which do not limit the industry to certain device sizes and packing densities. Accordingly, there is a need in the art for alternative capacitance solutions in the fabrication and operation of electronic devices and their packages.

DETAILED DESCRIPTION OF THE INVENTION

Figure 1:
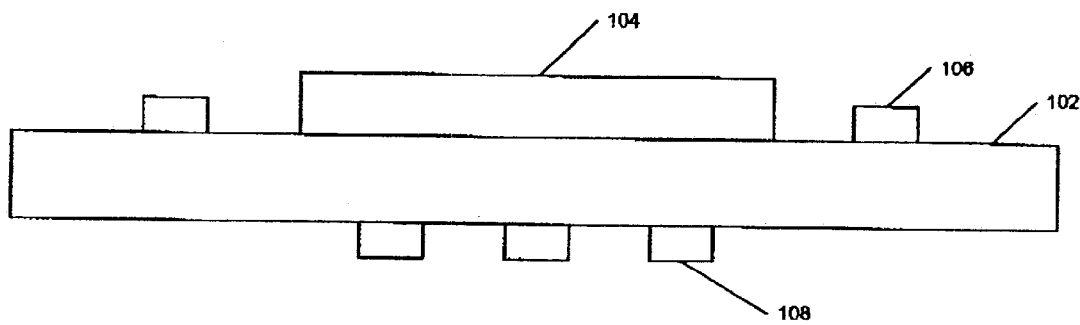
FIG. 1 illustrates a cross-section of an integrated circuit package having die side and land side capacitors in accordance with the prior art.
Figure 2:
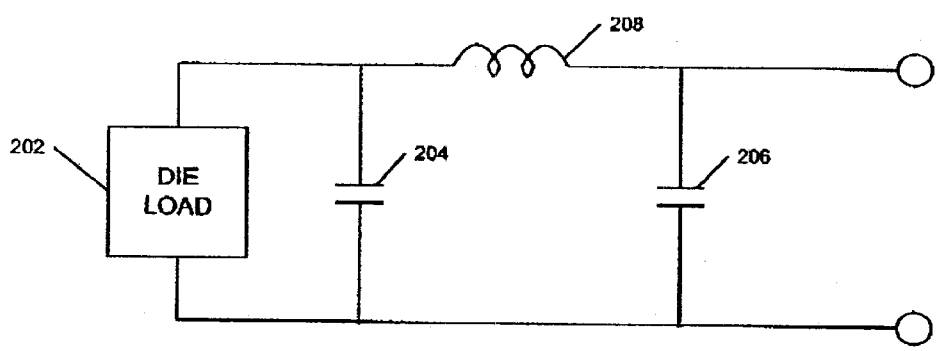
FIG. 2 illustrates an electrical circuit that simulates the electrical characteristics of the capacitors illustrated in FIG. 1.
Figure 3:
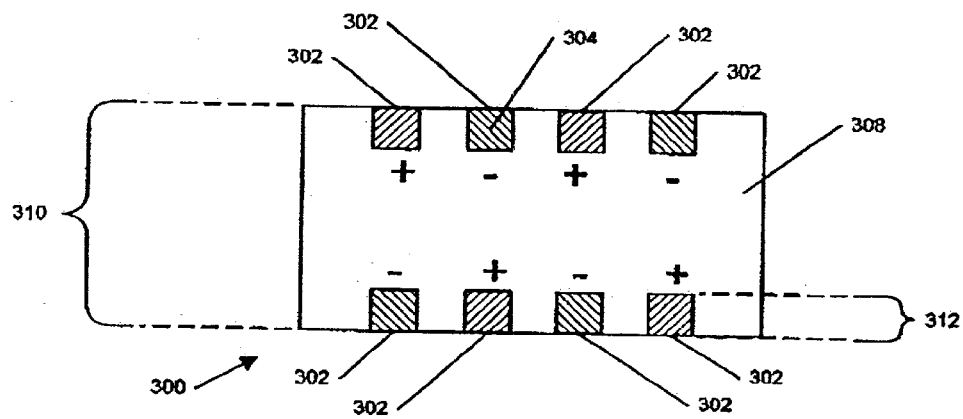
FIG. 3 illustrates a top view of an eight contact discrete capacitor in accordance with the prior art.
Figure 4:
FIG. 4 illustrates a side view of a discrete capacitor in accordance with the prior art.
Figure 5:
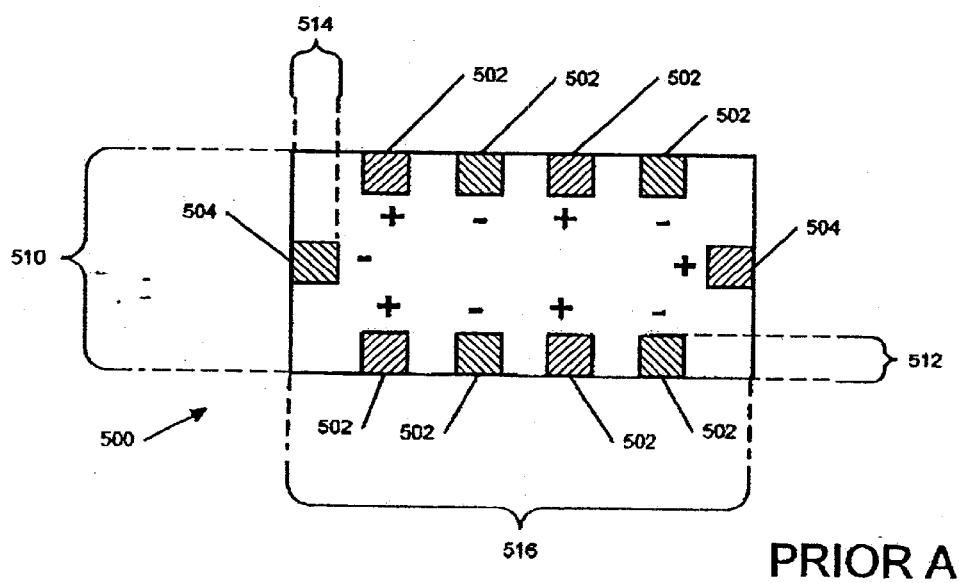
FIG. 5 illustrates a top view of a ten contact discrete capacitor in accordance with the prior art.

Various embodiments of the present invention provide a capacitor that includes one or more extended surface lands. In various embodiments, an "extended surface land" (also referred to herein as an "extended land") is a land on a top or bottom surface of a capacitor that has a land length that is equal to at least 30% of the width of the capacitor or 20% the length of the capacitor. Capacitors that include one or more extended land, referred to herein as "extended land capacitors," can be surface mounted to an electronic circuit substrate (e.g., an integrated circuit package, interposer, socket or printed circuit (PC) board), or they can be embedded within an electronic circuit substrate.

When mounted on or embedded within a substrate, the extended land capacitors of the various embodiments provide several advantages. First, an extended surface land can provide a substantially more reliable connection to the capacitor than may be possible using prior art lands. When an extended land capacitor is surface mounted to or embedded within a substrate, a substantial portion of the extended land can be electrically connected to a trace within or on the surface of the substrate. Because the connection can be larger than is possible with a capacitor having prior art lands, the connection can carry higher currents and will be less susceptible to vibration damage and other types of fatigue.

When an extended land capacitor is embedded within a substrate, multiple vias can be connected to each extended surface land, in one embodiment, which is not possible using capacitors with prior art lands. In the event that one of these vias fails (e.g., due to high currents), other vias are still available to carry current to and from the capacitor. Reliable connection to an embedded capacitor is important to ensure that the inductance between the capacitor and its load remains consistent from substrate to substrate and over time.

Another benefit to using extended surface lands is that they can provide more current carrying capacity to the capacitor than might be possible using prior art lands. A single conventional land has a current carrying capacity that is limited by the land's area or the cross sectional area of the via or other connection that carries the current to the land. In contrast, an extended surface land enables multiple conventional vias or a larger connection to electrically connect to each land, thus multiplying the amount of current that can be carried to the extended land and to the internal capacitor structure.

Still another benefit to using extended land capacitors, which is alluded to above, is that the inductance and resistance between the capacitor and the load can be reduced. This is because more or larger connections (e.g., vias or traces) can exist between the capacitor and the load. In addition, because the capacitor can be embedded within the substrate underneath a die, the loop area, and thus the inductance, may be smaller than with surface mounted devices.

Figure 6:
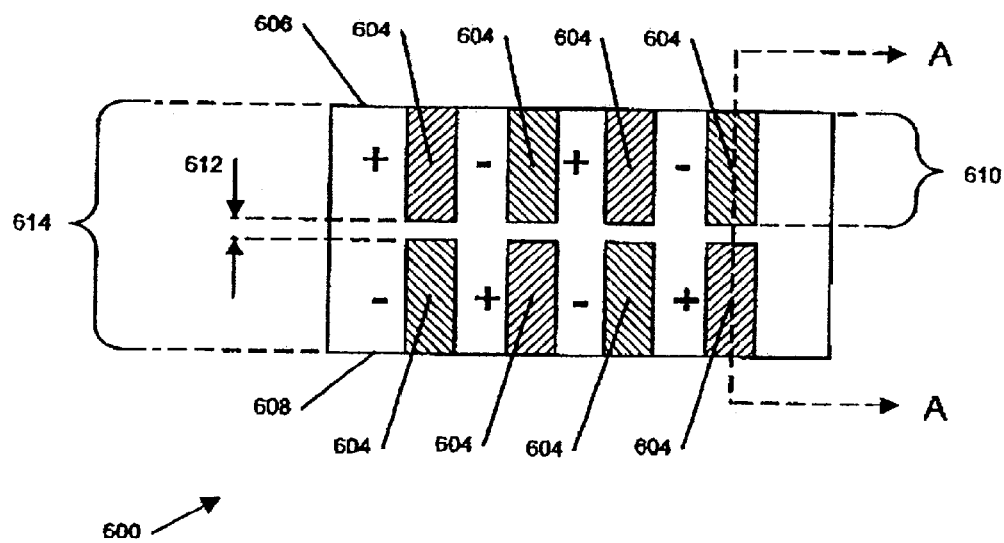
FIG. 6 illustrates a top view of an extended surface land capacitor in accordance with one embodiment of the present invention.

FIG. 6 illustrates a top view of an extended land capacitor 600 in accordance with one embodiment of the present invention. Capacitor 600 includes eight contacts, which provide electrical connections to electrodes of an internal capacitor structure (not shown) within capacitor 600. Going clockwise from the upper left contact, the polarities of the contacts alternate between positive and negative. This results in opposing contacts (ie., contacts directly opposite each other) having opposite polarities.

Each contact includes surface lands 604 on the top surface and/or bottom surface of capacitor 600. Each top and bottom land pair is electrically connected through a side termination (not shown) on a side surface of capacitor 600. Each of the electrodes of the internal capacitor structure electrically connects with every other one of the side terminations, and thus with the surface lands 604, as will be explained in more detail later in conjunction with FIGS. 12 and 13.

The width of capacitor 600 is indicated by dimension 614. Although the terms "length" and "width" are used herein to describe particular dimensions of capacitors in the various Figures, these terms are not meant to imply that the invention is applicable only to rectangular shaped capacitors. On the contrary, the various embodiments of the present invention are applicable to capacitors having rectangular shapes, square shapes, and other shapes.

One or more of surface lands 604 is an extended surface land. In one embodiment, an "extended surface land" is a side land on a top or bottom surface of a capacitor that has a land length 610 that is equal to at least 30% of the width 614 of the capacitor 600, where a "side land" is a surface land that touches a top edge 606 or a bottom edge 608 of the capacitor 600. For example, an extended land capacitor having a width 614 of 1.3 mm will have lands 604 with lengths 610 of about 0.39 mm or more. An extended surface land is differentiated from a conventional land used in prior art capacitors, in that the conventional land has a land length that is less than 30% of the width of the capacitor. As used herein, the "land length" is defined as the length of a surface land from the edge of a capacitor to the end of the land, in a direction perpendicular to the edge.

In another embodiment, an "extended surface land" is a side land on a top or bottom surface of a capacitor that has a land length 610 such that a gap 612 between the extended surface land and a surface land touching an opposite edge of the capacitor is no more than 5% of the width 614 of the capacitor 600. Using the previous example, an extended land capacitor having a width 614 of 1.3 mm will have a gap 612 between lands 604 of about 0.07 mm or less. Extended surface lands could be implemented in capacitors that are larger or smaller than 1.3 mm wide as well.

Figure 7:
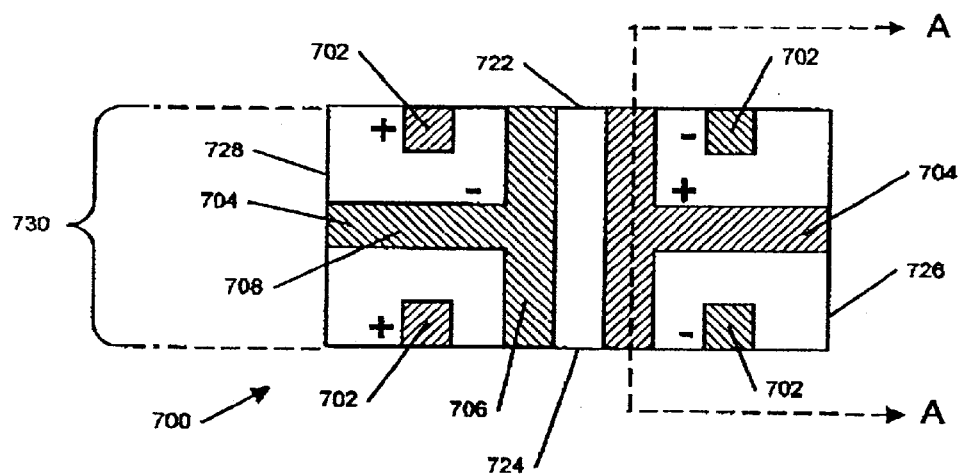
FIG. 7 illustrates a top view of an extended surface land capacitor in accordance with a second embodiment of the present invention.

Although FIG. 6 illustrates an eight contact capacitor 600, capacitors can have more or fewer contacts, in other embodiments. FIG. 7 illustrates a top view of an extended surface land capacitor 700 having six contacts in accordance with a second embodiment of the present invention. Capacitor 700 is similar to capacitor 600 (FIG. 6), except that the number of contacts and the structure of the extended surface lands are different.

Each contact includes surface lands 702, 704 on the top and/or bottom surface of capacitor 700. Each top and bottom land pair is electrically connected through one or more side terminations (not shown) on side surfaces of capacitor 700. The six contacts provide electrical connections to electrodes of an internal capacitor structure (not shown) within capacitor 700. Each of the electrodes of the internal capacitor structure electrically connects with every other one of the side terminations, as will be explained in more detail later in conjunction with FIGS. 12 and 13.

Four of the six contacts include surface lands 702 that extend only from the top or bottom edges 722, 724, while two of the six contacts include surface lands 704 that extend from both the top and bottom edges 722, 724 and also from the left edge 728 or the right edge 726. One or more of surface lands 702 can be conventional lands or they can be extended lands, in various embodiments.

In contrast, surface lands 704 are extended surface lands, in one embodiment. Each of the extended lands 704 includes two conductive segments 706, 708. First segments 706 extend from top edge 722 to bottom edge 724 across a width 730 of capacitor 700. Second segments 708 extend perpendicularly from about the center of each first segment 706 to a right edge 726 or a left edge 728 of capacitor 700. Accordingly, each extended land 704 forms a "T" shaped land, in one embodiment.

In this embodiment, an "extended surface land" is a land on a top or bottom surface of a capacitor having a land length that extends the entire width 730 of the capacitor. An "extended surface land" can also be defined, in accordance with this embodiment, as a land on a top or bottom surface of a capacitor having a first segment with a land length that extends the entire width of the capacitor, and a second segment with a land length that extends from the first segment to a left or right edge of the capacitor. In other embodiments, an "extended surface land" is an end land on a top or bottom surface of a capacitor having a land length that extends the entire length of the capacitor, where an "end land" is a surface land that touches a left edge or a right edge of the capacitor.

Lands 702 make contact with a capacitor edge 722, 724 only once, while each of extended lands 704 make contact with a capacitor edge 722, 724, 726, 728 three times. Accordingly, lands 702 and lands 704 make contact with edges 722, 724, 726, 728 a total of ten times. Going clockwise from the upper left surface land 702, and looking at the polarity of lands 702 and 704 each time they touch an edge 722, 724, 726, 728, the polarities alternate between positive and negative.

Figure 8:
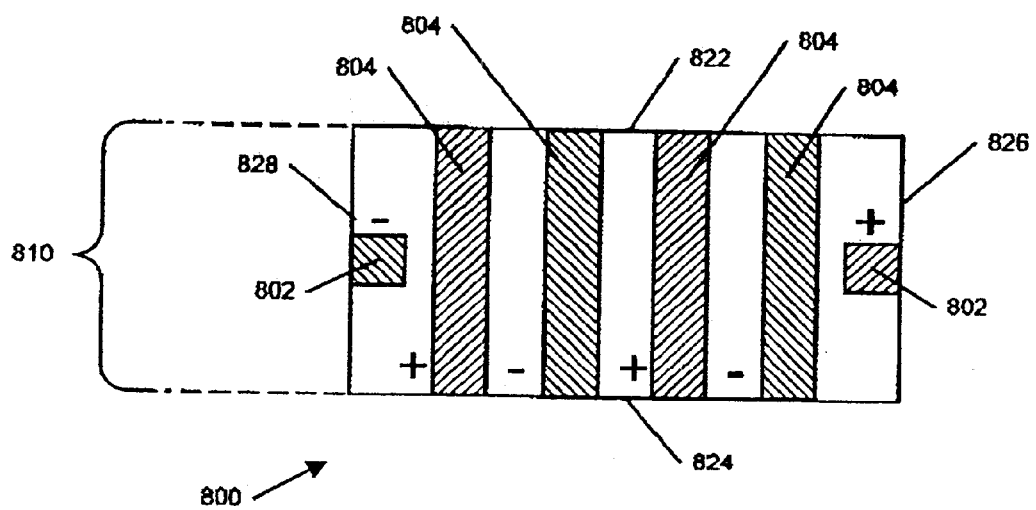
FIG. 8 illustrates a top view of an extended surface land capacitor in accordance with a third embodiment of the present invention.

FIG. 8 illustrates a top view of an extended surface land capacitor 800 having six contacts in accordance with a third embodiment of the present invention. Capacitor 800 is similar to capacitor 600 (FIG. 6), except that the number of contacts and the structure of the extended surface lands are different.

Each contact includes surface lands 802, 804 on the top and/or bottom surface of capacitor 800. Each top and bottom land pair is electrically connected through one or two side terminations (not shown) on side surfaces of capacitor 800. The six contacts provide electrical connections to electrodes of an internal capacitor structure (not shown) within capacitor 800. Each of the electrodes of the internal capacitor structure electrically connects with every other one of the side terminations, as will be explained in more detail later in conjunction with FIGS. 12 and 13.

Two of the six contacts include surface lands 802 that extend only from the left or right edges 828, 826, while four of the six contacts include surface lands 804 that extend from the top edge 822 to the bottom edge 824, across a width 810 of capacitor 800. One or more of surface lands 802 can be conventional lands or they can be extended lands, in various embodiments.

In contrast, surface lands 804 are extended surface lands, in one embodiment. In this embodiment, an "extended surface land" is a side land on a top or bottom surface of a capacitor having a land length that extends the entire width of the capacitor.

Lands 802 make contact with a capacitor edge 826, 828 only once, while each of extended lands 804 make contact with a capacitor edge 822, 824, twice. Accordingly, lands 802 and lands 804 make contact with edges 822, 824, 826, 828 a total of ten times. Going clockwise from the upper left surface land 804, and looking at the polarity of lands 802 and 804 each time they touch an edge 822, 824, 826, 828, the polarities alternate between positive and negative.

Figure 9:
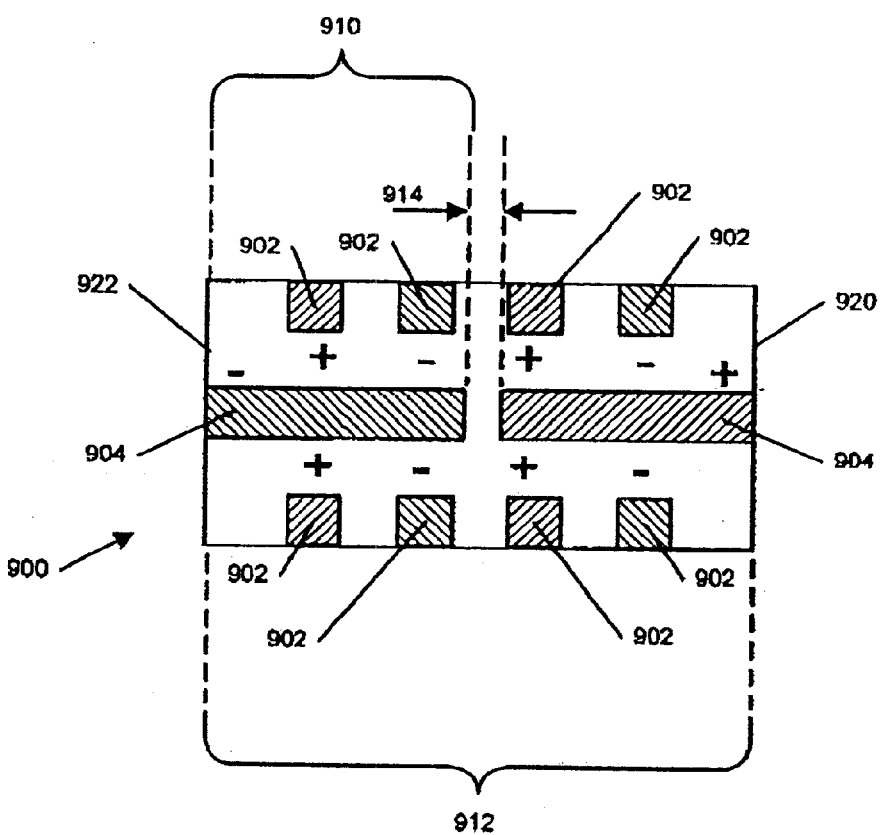
FIG. 9 illustrates a top view of an extended surface land capacitor in accordance with a fourth embodiment of the present invention.

FIG. 9 illustrates a top view of an extended surface land capacitor 900 having ten contacts in accordance with a fourth embodiment of the present invention. Capacitor 900 is similar to capacitor 600 (FIG. 6), except that the number of contacts and the structure of the extended surface lands are different.

Each contact includes surface lands 902, 904 on the top surface and/or bottom surface of capacitor 900. Each top and bottom land pair is electrically connected through a side termination (not shown) on a side surface of capacitor 900. The ten contacts provide electrical connections to electrodes of an internal capacitor structure (not shown) within capacitor 900. Each of the electrodes of the internal capacitor structure electrically connects with every other one of the side terminations, and thus with the surface lands 902, 904, as will be explained in more detail later in conjunction with FIGS. 12 and 13.

One or more of surface lands 902 can be conventional lands or they can be extended lands, in various embodiments. In contrast, one or both of surface lands 904 are extended surface lands, in one embodiment. Going clockwise from the upper left surface land 902, and looking at the polarity of lands 902 and 904, the polarities alternate between positive and negative.

In the embodiment shown, an "extended surface land" is an end land on a top or bottom surface of a capacitor that has a land length that is equal to at least 20% of the length of the capacitor. For example, an extended land capacitor having a length 912 of 2.0 mm will have lands 904 with lengths 910 of about 0.39 mm or more.

In another embodiment, an "extended surface land" is an end land on a top or bottom surface of a capacitor that has a land length such that a gap between the extended surface land and a surface land that contacts an opposite side of the extended surface land is no more than 4% of the length of the capacitor. Using the previous example, an extended land capacitor having a length 912 of 2.0 mm will have a gap 914 between lands 904 of about 0.07 mm or less. Extended surface lands could be implemented in capacitors that are larger or smaller than 2.0 mm long as well.

In still another embodiment, an "extended surface land" is a land on a top or bottom surface of a capacitor that electrically connects two or more side terminations having the same polarity. This definition includes lands 604 and 704, illustrated in FIGS. 6 and 7, respectively. In addition, it includes a land that forms an electrically conductive plane on the top or bottom surface of the capacitor, where the plane connects from two to all side terminations of the same polarity, and the plane has voids that allow the opposite polarity lands to be electrically isolated from the plane. In one embodiment, a single planar land is used to connect all side terminations of the same polarity. In other embodiments, multiple planes could cover the top or bottom surface of the land. For example, one plane could electrically connect two or more positive side terminations, and another plane could electrically connect two or more negative side terminations.

In various embodiments, each capacitor 600, 700, 800, 900 illustrated in FIGS. 6–9 could be a ceramic capacitor, aluminum oxide capacitor, organic capacitor or a capacitor made with virtually any other technology, as would be obvious to one of skill in the art based on the description herein. The dimensions of capacitors 600, 700, 800, 900 could vary widely, depending on design and manufacturing constraints or other factors. In addition, capacitors 600, 700, 800, 900 need not necessarily be rectangular in shape, as they could assume a number of different shapes (e.g., square, circular, or multi-sided).

Although the capacitors 600, 700, 800, 900 illustrated in FIGS. 6–9 depict lands on opposite sides as being symmetrical, the lands could be asymmetrical in other embodiments. For example, a land on the top side of capacitor 600 (FIG. 6) could be a conventional land, and a land on the bottom side of the capacitor could be an extended land, or vice versa. In addition, although particular lands of capacitors 600, 700, 800, 900 are shown as extended surface lands, one or more of those lands could be conventional lands, and one or more of the lands depicted as conventional lands could be extended surface lands.

In each of the capacitors 600, 700, 800, 900 depicted in FIGS. 6–9, the polarities of the lands, as they contact the edges of the capacitors, alternates between positive and negative around the circumference of the capacitor. In alternate embodiments, the polarities of the lands do not strictly alternate, and two or more lands that occur in sequence while traveling around the edges of the capacitor could have the same polarity. In such cases, the shapes of the extended surface lands could be modified to electrically connect any or all of the lands having the same polarity. In addition, the extended surface lands need not always be rectangular in shape. For example, extended surface lands that diagonally connect same-polarity terminations could be used, in other embodiments.

Although the capacitors 600, 700, 800, 900 illustrated in FIGS. 6–9 are shown to have six, eight or ten contacts on two or four sides of the capacitors, a capacitor could have more or fewer contacts, and those contacts could be located on more or fewer sides of the device, in other embodiments. Specifically, the capacitor's contacts could be on 1, 2, 3 or more sides, and some or all surface lands associated with these contacts could be extended surface lands.

FIGS. 6–9 are intended to show several discrete capacitors that could have extended surface lands in conjunction with various embodiments of the present invention. These examples are not intended to be limiting in any sense, as one of skill in the art would understand, based on the description herein, that numerous different types of discrete capacitors or other discrete devices (e.g., inductors, transistors, resistors, etc.) could implement the extended surface lands of the various embodiments. Specifically, capacitors or other devices having more or fewer contacts and having different shapes and relative sizes could be used.

As mentioned previously, the extended surface land capacitors of the various embodiments can be mounted on or embedded within an electronic substrate (e.g., a package, interposer, socket or PC board). Either way, the larger surface area of the extended lands provides the advantages of more reliable, lower inductance connections to the internal capacitor structure. Using the extended surface land capacitors as embedded capacitors can provide additional advantages. In particular, the capacitors can be embedded within an integrated circuit package in a manner that the capacitors are closer to die loads than is possible using surface mounted capacitors. Accordingly, the embedded capacitors can respond more quickly and with less inductance than the surface mounted capacitors, in many cases.

Figure 10:
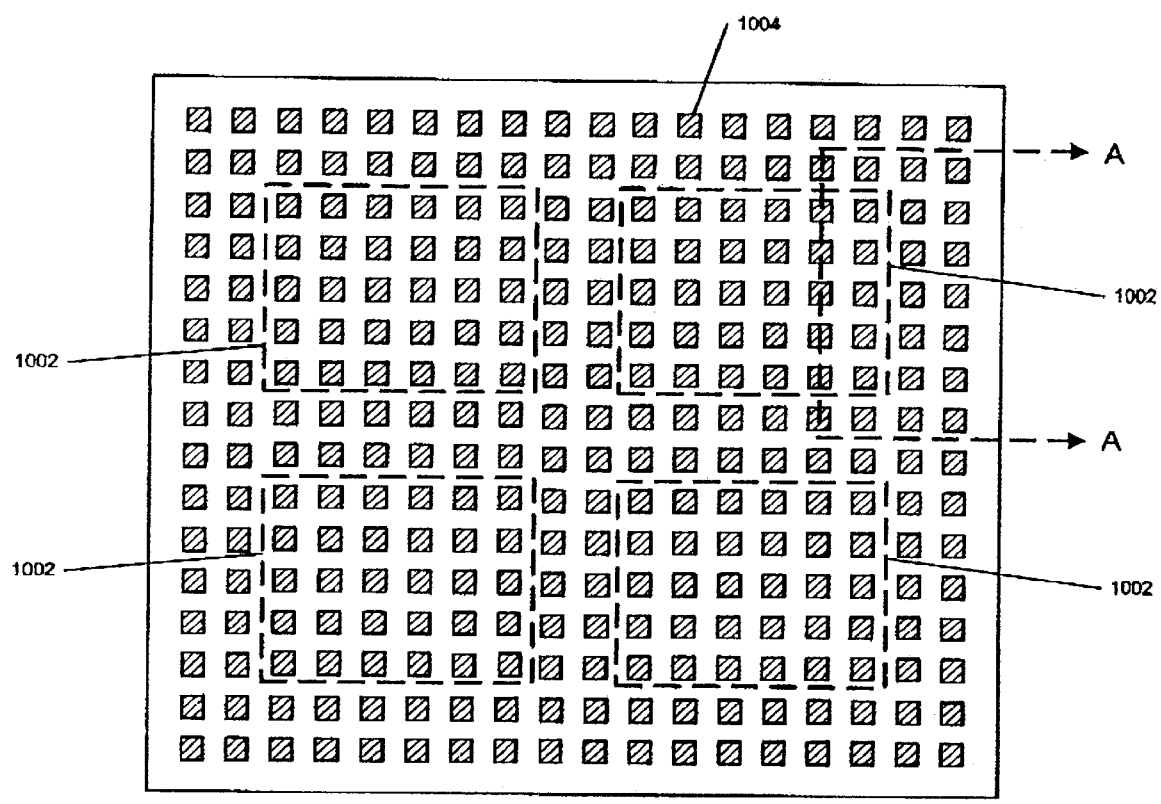
FIG. 10 illustrates a top view of an electronic package including embedded, extended surface land capacitors in accordance with one embodiment of the present invention.

FIG. 10 illustrates a top view of an electronic package 1000 including embedded, extended surface land capacitors 1002 in accordance with one embodiment of the present invention. In one embodiment, package 1000 includes multiple, conductive bonding pads 1004 on its top surface, which are electrically connectable to complementary pads on an integrated circuit (not shown). Some or all of pads 1004 are electrically connected to vias (not shown), which in turn connect various layers of package 1000 or devices embedded within package 1000 with the top surface.

Package 1000 includes one or more embedded, extended surface land capacitors 1002, each of which is electrically connectable to a set of bonding pads 1004 through vias. FIG. 10 shows thirty bonding pads 1004 located substantially above each of the capacitors 1002, which indicates that up to thirty vias could electrically connect each capacitor 1002 to the top surface. In various embodiments, more or fewer bonding pads 1004 could connect to each capacitor 1002, and more or fewer capacitors 1002 could be embedded within the package 1000.

Figure 11:
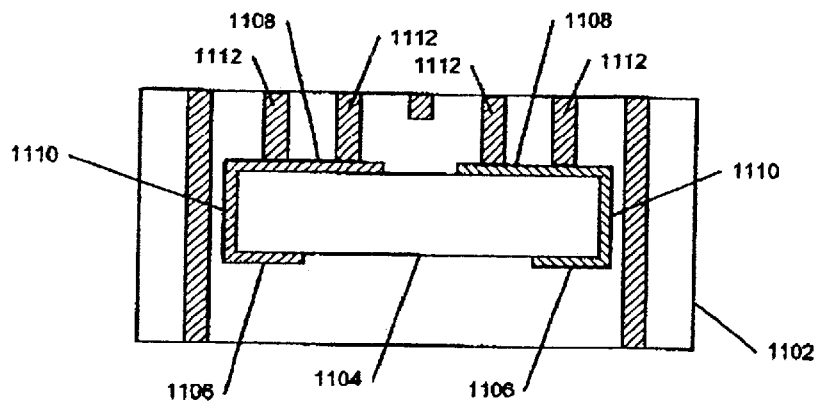
FIG. 11 illustrates a cross section of the electronic package shown in FIG. 10 along section lines A—A.

FIG. 11 illustrates a cross section of the electronic package shown in FIG. 10 along section lines A—A. Embedded within the section of the package 1102 is a discrete capacitor 1104. Discrete capacitor 1104 includes two or more contacts 1106, each of which includes extended lands 1108 on the top and/or bottom surfaces of capacitor 1104. Lands 1108 are electrically connected to a side surface of capacitor 1104, and thus to an internal capacitor structure (not shown) via side terminations 1110.

One or more vias 1112 extend from the top surface of the package 1102 or from one or more other package layers, and make electrical contact with extended lands 1108. In the embodiment shown in FIG. 11, two vias 1112 make contact with each extended land 1108. Accordingly, in this embodiment, an "extended surface land" is a side or end land on a top or bottom surface of a capacitor having a land length that is long enough for two or more vias, which are insulated from each other, to be connected to the land. In other embodiments, more vias 1112 could make contact with each extended land 1108, or fewer vias 1112 could make contact with each extended land 1108, even though the extended land 1108 is long enough for at least two via connections. Two advantages to electrically connecting multiple vias 1112 to an extended land 1108 are that more current can be carried to the land 1108, and a connection can still exist when one, but fewer than all, of the vias 1112 connecting to the land 1108 fail.

In the embodiment shown, vias 1112 make contact with extended lands 1108 on the top surface of capacitor 1104. In other embodiments, one or more vias could make contact with conventional and/or extended lands on the bottom surface of capacitor 1104. In addition, FIG. 11 does not completely illustrate the various conducting and non-conducting layers of package 1102, for ease of description. In an actual package design, one or more conducting and/or non-conducting layers could exist above, below, or in parallel with capacitor 1104. In order to minimize the loop inductance between capacitor 1104 and a die load, it may be desirable to embed capacitor 1104 as close to the top surface of the package 1102 as possible, although this is not essential. The capacitors could be embedded in one or multiple layers of a single package.

Figure 12:
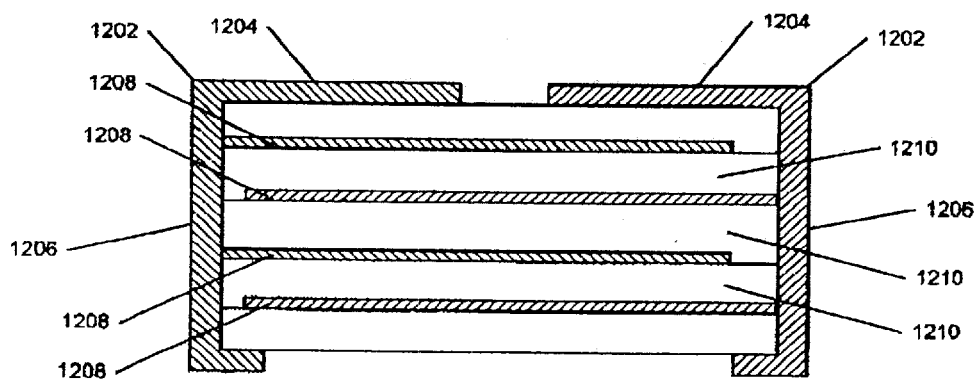
FIG. 12 illustrates a cross section of the extended surface land capacitor shown in FIG. 6 along section lines A—A.

Various embodiments of the internal capacitor structure will now be described in conjunction with FIGS. 12 and 13. FIG. 12 illustrates a cross section of the extended surface land capacitor 1200 shown in FIG. 6 along section lines A—A. Capacitor 1200 could be embedded in a substrate, such as an integrated circuit package, interposer, socket and/or PC board, and electrically connected to the top of the substrate and/or one or more other layers of the substrate using vias, as described in conjunction with FIG. 11.

Capacitor 1200 includes two or more contacts 1202, each of which includes extended lands 1204 on the top and/or bottom surfaces of capacitor 1200. Lands 1204 are electrically connected to a side surface of capacitor 1200, and thus to an internal capacitor structure, via side terminations 1206.

The internal capacitor structure includes two or more electrodes 1208, formed of conductive material, and separated by one or more layers 1210 of dielectric material. Moving downward from the top electrode 1208, the electrodes 1208 electrically connect, in an alternating manner, to the left and right side terminations 1206. Accordingly, these electrodes and non-conductive layers 1208, 1210 supply a capacitive charge when the left and right extended lands 1204 are electrically connected to power and ground, respectively. In this embodiment, the left and right extended lands 1204 have opposite polarities.

Figure 13:
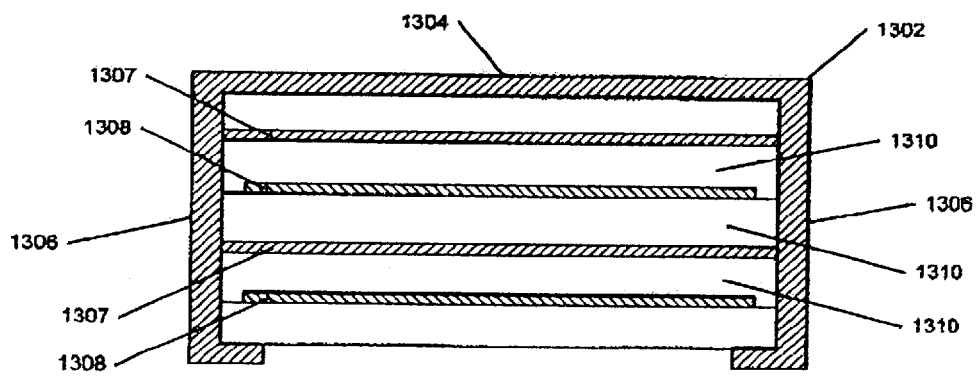
FIG. 13 illustrates a cross section of the extended surface land capacitor shown in FIG. 7 along section lines A—A.

FIG. 13 illustrates a cross section of the extended surface land capacitor 1300 shown in FIG. 7 along section lines A—A. Capacitor 1300 could be embedded in a substrate and electrically connected to the top of the substrate and/or one or more other layers of the substrate using vias, as described in conjunction with FIG. 11.

Capacitor 1300 includes two or more contacts, although only a single contact 1302 is visible along cross section A—A. Each contact 1302 includes one or more extended lands 1304 on the top and/or bottom surfaces of capacitor 1300. Land 1304 is electrically connected to the side surfaces of capacitor 1300, and thus to an internal capacitor structure, via side terminations 1306.

The internal capacitor structure includes two or more electrodes 1307, 1308, formed of conductive material, and separated by one or more layers 1310 of dielectric material. Moving downward from the top electrode 1307, electrodes 1307 electrically connect to both side terminations 1306, and electrodes 1308 do not connect to either side termination 1306. Those of the electrodes 1308 that do not connect to the side terminations 1306 connect to another contact (not shown) on capacitor 1300. Accordingly, electrodes 1307, 1308 and non-conductive layers 1310 supply a capacitive charge when the extended land 1304 and the other contact (not shown) are electrically connected to power and ground, respectively. In this embodiment, the left and right side terminations 1306 have the same polarity.

In one embodiment, the internal capacitor structures shown in FIGS. 12 and 13 are ceramic capacitors. In other embodiments, the structures could be formed from other inorganic or organic materials, many of which are known to those of skill in the art. Although four electrodes 1208, 1307, 1308 are shown in each of FIGS. 12 and 13, more or fewer electrodes could be used in other embodiments.

Figure 14:
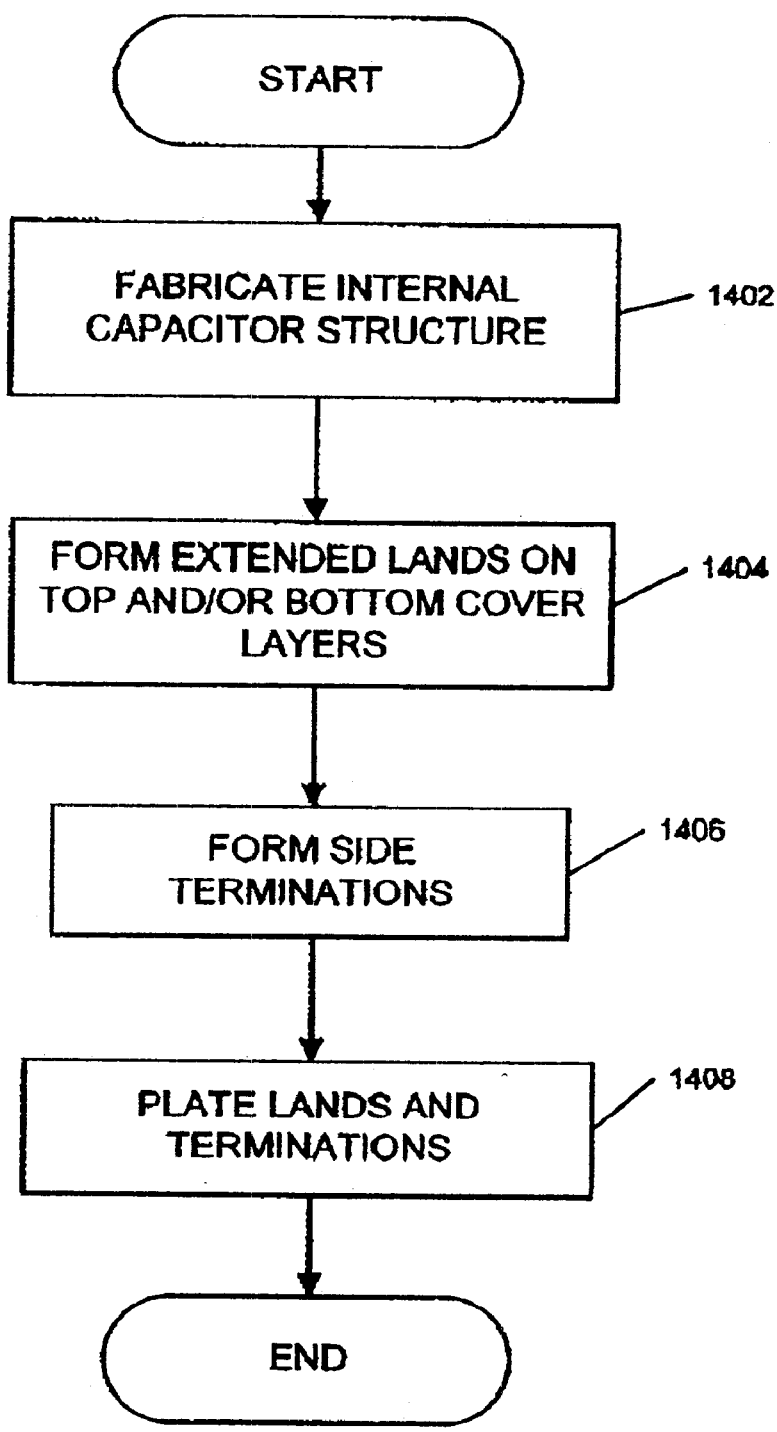
FIG. 14 illustrates a flowchart of a method for fabricating an extended surface land capacitor in accordance with one embodiment of the present invention.
Figure 16:
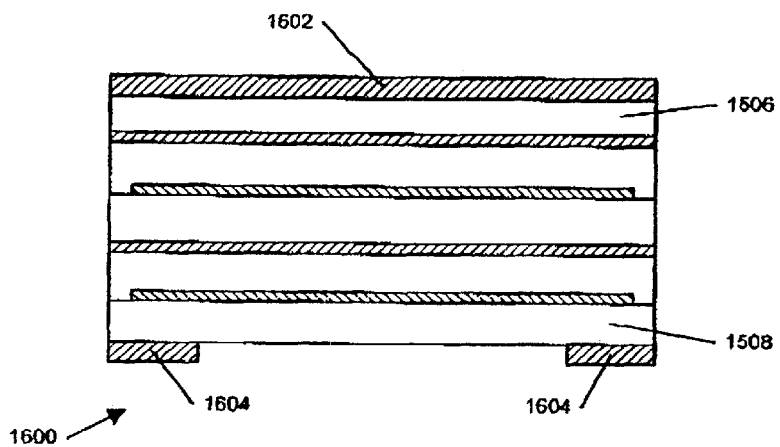
Figure 17:
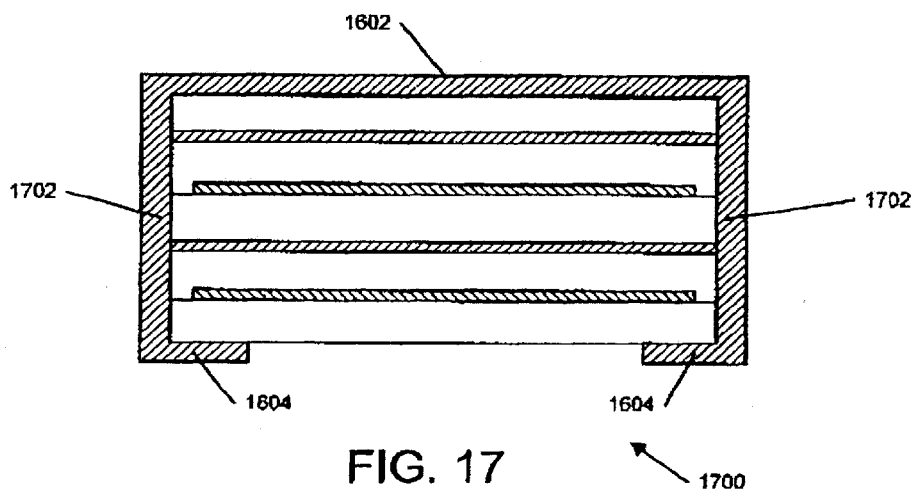

FIG. 14 illustrates a flowchart of a method for fabricating an extended surface land capacitor in accordance with one embodiment of the present invention. FIG. 14 should be viewed in conjunction with FIGS. 15–17, which are schematic cross sections illustrating various stages of fabricating an extended surface land capacitor in accordance with one embodiment of the present invention.

Figure 15:
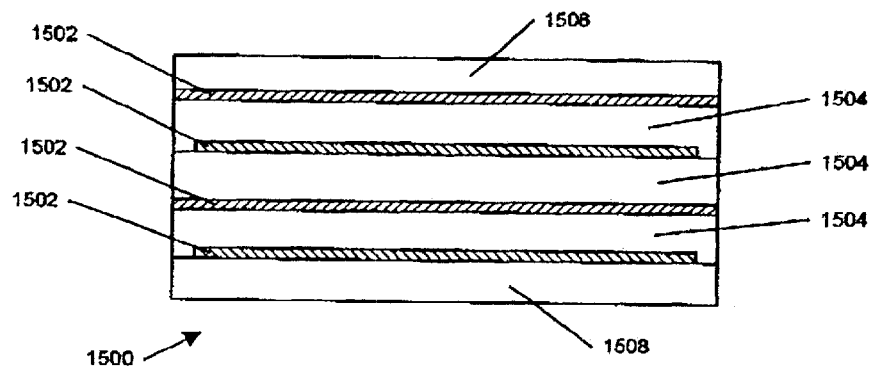
FIGS. 15–17 are schematic cross sections illustrating various stages of fabricating an extended surface land capacitor in accordance with one embodiment of the present invention.

The method begins, in block 1402, by fabricating an internal capacitor structure 1500 (FIG. 15). Internal capacitor structure 1500 includes two or more electrodes 1502, formed of conductive material, and separated by one or more layers 1504 of dielectric material. In addition, in one embodiment, a top cover layer 1506 of dielectric material exists over the top electrode 1502, and a bottom cover layer 1508 exists under the bottom electrode 1502.

In one embodiment, dielectric layers 1504 and cover layers 1506, 1508 are formed of a ceramic material, and electrodes 1502 are formed on the layers using a screen printing process. Electrodes 1502 could be formed from copper, nickel, silver, palladium-silver, tin, gold or other conductive materials, as is known to those of skill in the art. The screen printed ceramic layers 1504 and cover layers 1506, 1508 are then stacked, pressed, and cofired using fabrication techniques known to those of skill in the art.

In other embodiments, structure 1500 could be formed from organic materials, such as FR-4 epoxy-glass, polymide-glass, benzocyclobutene, Teflon, other epoxy resins, injection molded plastic or the like. Standard procedures for building up levels of conductive and insulating layers can then be employed using techniques known to those of skill in the art, thus creating a multiple layer structure 1500. These techniques can include, for example, any combination of photolithography, material deposition, plating, printing, lamination, and other processes for selectively adding or removing conductive and non-conductive materials.

In still other embodiments, structure 1500 could be a semiconductor structure. Accordingly, various semiconductor fabrication techniques, including material deposition and doping techniques, could be used to form the structure.

In block 1404, lands 1602, 1604 (FIG. 16) are formed on the top and/or bottom cover layers 1506, 1508 of the capacitor structure 1600. In one embodiment, this is done by screen printing lands 1602, 1604 on the top and/or bottom cover layers 1506, 1508. Other conductive material deposition techniques known to those of skill in the art could be used in other embodiments.

Either or both lands 1602, 1604 can be extended lands, in various embodiments. Lands 1602, 1604 could be formed from copper, nickel, silver, palladium-silver, tin, gold or other conductive materials, as is known to those of skill in the art.

In one embodiment, lands 1602, 1604 are formed after the internal capacitor structure 1500 illustrated in FIG. 15 has been completed. In another embodiment, lands 1602 and/or 1604 could be formed during formation of internal capacitor structure 1500. For example, in one embodiment, internal capacitor structure 1500 is a ceramic structure, and either or both lands 1602, 1604 could be formed before the various layers are stacked, pressed, and cofired. Therefore, in various embodiments, blocks 1402 and 1404 could be performed together or in sequence. In still another alternate embodiment, lands 1602 and/or 1604 could be formed at a later time, such as when the capacitor is embedded within a housing.

Referring back to FIG. 14, side terminations 1702 (FIG. 17) are then formed, in block 1406, on side surfaces of the capacitor 1700. Side terminations 1702 electrically connect lands 1602, 1604 with the internal electrodes.

In one embodiment, side terminations 1702 are formed using a dipping and/or striping process, as is known to those of skill in the art. Other conductive material deposition techniques known to those of skill in the art could be used in other embodiments. Side terminations 1702 could be formed from copper, nickel, silver, palladium-silver, tin, gold or other conductive materials, as is known to those of skill in the art.

Finally, the lands 1602, 1604 and side terminations 1702 are plated, if necessary, in block 1408, and the method ends. Plating the lands and terminations is performed, in one embodiment, using a barrel plating process. Other plating techniques known to those of skill in the art could be used in other embodiments. The plating process could use any of a number of conductive metals, including copper, nickel, silver, palladium-silver, tin, gold or other conductive materials, as is known to those of skill in the art.

Figure 18:
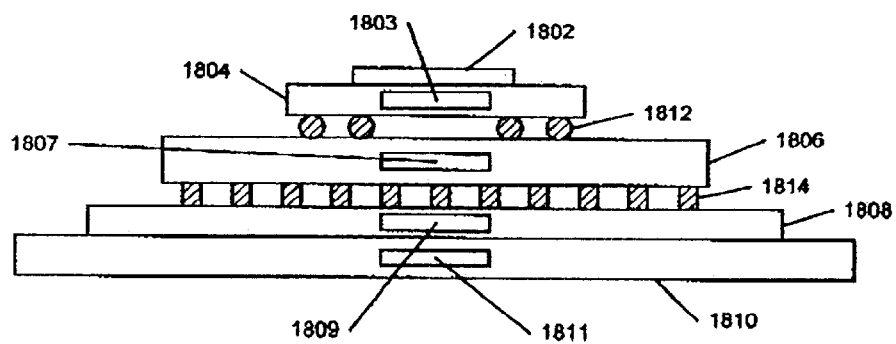
FIG. 18 illustrates an integrated circuit package, interposer, socket, and printed circuit board, each of which could include one or more embedded, extended surface land capacitors in accordance with various embodiments of the present invention.

As described previously, extended surface land capacitors, such as those described in the various embodiments above, can be included within an integrated circuit package, interposer, socket, and/or PC board. FIG. 18 illustrates an integrated circuit package, interposer, socket, and PC board, each of which could include one or more embedded, extended surface land capacitors in accordance with various embodiments of the present invention.

Starting from the top of FIG. 18, an integrated circuit 1802 is housed by integrated circuit package 1804. Integrated circuit 1802 contains one or more circuits, which are electrically connected to integrated circuit package 1804 by connectors (not shown).

Integrated circuit 1802 could be any of a number of types of integrated circuits. In one embodiment of the present invention, integrated circuit 1802 is a microprocessor, although integrated circuit 1802 could be a memory device, application specific integrated circuit, digital signal processor, or another type of device in other embodiments. In the example shown, integrated circuit 1802 is a "flip chip" type of integrated circuit, meaning that the input/output terminations on the chip can occur at any point on its surface. After the chip has been readied for attachment to integrated circuit package 1804, it is flipped over and attached, via solder bumps or balls to matching pads on the top surface of integrated circuit package 1804. Alternatively, integrated circuit 1802 could be wire bonded, where input/output terminations are connected to integrated circuit package 1804 using bond wires to pads on the top surface of integrated circuit package 1804.

One or more of the circuits within integrated circuit 1802 acts as a load, which may require capacitance, noise suppression, and/or voltage dampening. Some of this capacitance is provided, in one embodiment of the present invention, by capacitors 1803 embedded within package 1804. These capacitors 1803 are electrically connected to the integrated circuit loads, at least in part, using one or more extended surface lands, as described above. In this manner, one or more levels of additional capacitance are provided to integrated circuit 1802, also providing voltage dampening and noise suppression, when needed. The close proximity of these off-chip sources of capacitance means that each source has a relatively low inductance path to the die.

In other embodiments, extended land capacitors 1807, 1809, 1811 are embedded within interposer 1806, socket 1808, PC board 1810 or some combination thereof. Integrated circuit package 1804 is coupled to interposer 1806 using solder connections, such as ball grid array connections 1812, for example. In another embodiment, integrated circuit package 1804 could be electrically and physically connected to interposer 1806 using a pinned or other type of connection.

Interposer 1806 is coupled to PC board 1810 through a socket 1808 on PC board 1810. In the example shown, interposer 1806 includes pins 1814, which mate with complementary pin holes in socket 1808. Alternatively, interposer 1806 could be electrically and physically connected to PC board 1810 using solder connections, such as ball grid array connections, for example. In still another alternate embodiment, integrated circuit package 1804 could be connected directly to socket 1808 and/or PC board 1810, without using an interposer. In such an embodiment, integrated circuit package 1804 and PC board 1810 could be electrically and physically connected using ball grid array or pinned connections. Other ways of connecting integrated circuit package 1804 and PC board 1810 could also be used in other embodiments.

Printed circuit board 1810 could be, for example, a motherboard of a computer system. As such, it acts as a vehicle to supply power, ground, and signals to integrated circuit 1802. These power, ground, and other signals are supplied through traces or planes (not shown) on or within PC board 1810, socket 1808, interposer 1806, and integrated circuit package 1804.

Figure 19:
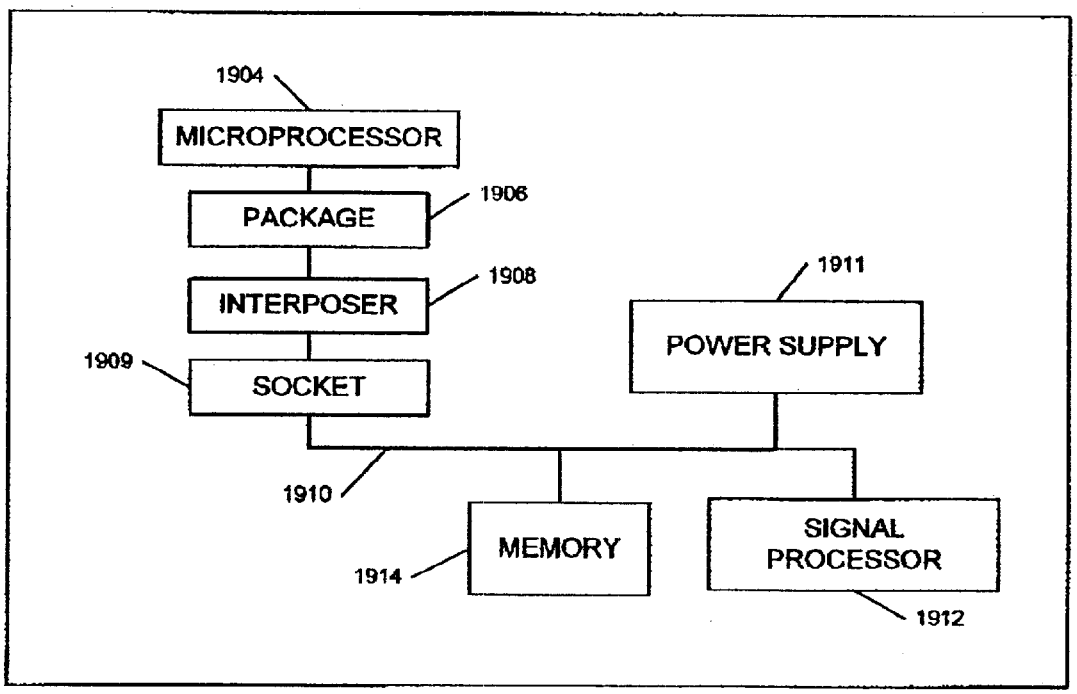
FIG. 19 illustrates a general-purpose electronic system in accordance with one embodiment of the present invention.

The configuration described above in conjunction with various embodiments could form part of a general purpose electronic system. FIG. 19 illustrates a general-purpose electronic system in accordance with one embodiment of the present invention. The system shown in FIG. 13 could be, for example, a computer, a wireless or wired communication device (e.g., telephone, modem, cell phone, pager, radio, etc.), a television, a monitor, or virtually any other type of electronic system.

The electronic system is housed on one or more PC boards, and includes microprocessor 1904, integrated circuit package 1906, interposer 1908, socket 1909, bus 1910, power supply 1911, signal processor 1912, and memory 1914. Integrated circuit package 1906, interposer 1908, socket 1909, and/or the PC board include one or more extended land capacitors or other devices that are mounted on or embedded within them, in accordance with various embodiments of the present invention. Integrated circuit package 1906, interposer 1908, and socket 1909 couple microprocessor 1904 to bus 1910 in order to deliver power and communication signals between microprocessor 1904 and devices coupled to bus 1910. In one embodiment, bus 1910 couples microprocessor 1904 to memory 1914, power supply 1911, and signal processor 1912. However, it is to be understood that in alternative embodiments of the present invention, microprocessor 1904 can be coupled to memory 1914, power supply 1911, and signal processor 1912 through different busses.

Conclusion

The description, above, defines extended lands in several ways, in several embodiments. Extended lands defined in other ways can be used in other embodiments, as will be described in the next two paragraphs.

For example, in another embodiment, an "extended surface land" is a side or end land on a top or bottom surface of a capacitor having a land length that is equal to at least 40% of the width of the capacitor. In still another embodiment, an "extended surface land" is a side or end land on a top or bottom surface of a capacitor having a land length that is equal to at least 50% of the width of the capacitor. In another embodiment, an "extended surface land" is an end land on a top or bottom surface of a capacitor that has a land length that is equal to at least 40% of the length of the capacitor.

In still another embodiment, an "extended surface land" is a side or end land on a top or bottom surface of a capacitor that has a land length such that a gap between the extended surface land and a surface land on an opposite side of the extended surface land is between 5% and 50% of the width of the capacitor. In still another embodiment, an "extended surface land" is an end land on a top or bottom surface of a capacitor that has a land length such that a gap between the extended surface land and a surface land that contacts an opposite side of the extended surface land is between 4% and 50% of the length of the capacitor. In still another embodiment, an "extended surface land" is a side or end land on a top or bottom surface of a capacitor having a length that is greater than 0.6 mm.

Various embodiments of a capacitor structure and methods of fabricating that structure have been described, along with a description of the incorporation of the structure within a substrate and a general-purpose electronic system. The description specifically refers to embedding a capacitor with one or more extended surface lands in a substrate. The capacitors of the various embodiments also could be surface mounted to a substrate, as well. In addition, the various embodiments of the extended surface lands could be applied to other discrete devices (e.g., inductors, resistors, transistors, etc.).

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, additional layers of patterned conductive materials and vias for carrying signals, power, and ground may exist between, above, between, or below the embedded capacitor structures shown in the Figures.

The various embodiments have been described in the context of providing excess, off-chip capacitance to a die. One of ordinary skill in the art would understand, based on the description herein, that the method and apparatus of the present invention could also be applied in many other applications where a capacitor having a low inductance, low resistance, and/or highly reliable path to a circuit load is desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps, which have been described and illustrated in order to explain the nature of this invention, may be made without departing from the spirit and scope of the invention as expressed in the adjoining claims.

What is claimed is:

1. A capacitor comprising:

an internal capacitor structure; and multiple extended surface lands, which are electrically connected to the internal capacitor structure through side terminations, and which are formed on a top surface of the capacitor, wherein each extended surface land has a land length that is long enough for two or more vias to be connected to the extended surface land, and the land length is a length of the extended surface land from an edge of the capacitor to an end of the extended surface land, in a direction perpendicular to the edge.

2. A capacitor comprising:

an internal capacitor structure;

an extended surface land, which is electrically connected to the internal capacitor structure through a side termination, and which is formed on a top surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge; and one or more additional extended surface lands, wherein at least one of the one or more additional extended surface lands has an opposite polarity from the extended surface land.

3. The capacitor as claimed in claim 2, wherein the internal capacitor structure includes ceramic.

4. The capacitor as claimed in claim 2, wherein the internal capacitor structure includes organic materials.

5. A capacitor comprising:

an internal capacitor structure; and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein the land length is equal to at least 30% of a width of the capacitor.

6. The capacitor as claimed in claim 5, wherein the land length is equal to at least 40% of a width of the capacitor.

7. The capacitor as claimed in claim 6, wherein the land length is equal to a width of the capacitor.

8. A capacitor comprising:

an internal capacitor structure; and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein the land length is equal to at least 20% of a length of the capacitor.

9. The capacitor as claimed in claim 8, wherein the land length is equal to a length of the capacitor.

10. A capacitor comprising:

an internal capacitor structure; and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein the land length results in a gap between the extended surface land and a surface land touching an opposite edge of the capacitor that is no more than 5% of a width of the capacitor.

11. A capacitor comprising:

an internal capacitor structure; and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein the land length results in a gap between the extended surface land and a surface land touching an opposite edge of the capacitor that is no more than 4% of a length of the capacitor.

12. A capacitor comprising:

an internal capacitor structure; and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein the extended surface land comprises:

a first segment that extends across a width of the capacitor; and a second segment that extends perpendicularly from about a center of the first segment to an edge of the capacitor.

13. A capacitor comprising:

an internal capacitor structure;

an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge; and two or more side terminations having a same polarity, located on a side of the capacitor and electrically connected to the extended surface land and to one or more electrodes of the internal capacitor structure, wherein the extended surface land forms an electrically conductive plane on the top or bottom surface of the capacitor, that connects the two or more side terminations, and the electrically conductive plane includes voids that allow opposite polarity lands to be electrically isolated from the electrically conductive plane.

14. A method for fabricating a capacitor, the method comprising:

fabricating an internal capacitor structure;

forming multiple extended surface lands on a top surface of the internal capacitor structure, wherein each extended surface land has a land length that is long enough for two or more vias to be connected to the extended surface land, and the land length is a length of the extended surface land from an edge of the capacitor to an end of the extended surface land, in a direction perpendicular to the edge; and forming one or more side terminations, which electrically connect the multiple extended surface lands to one or more electrodes of the internal capacitor structure.

15. The method as claimed in claim 14, wherein forming the internal capacitor structure comprises forming a ceramic capacitor structure.

16. The method as claimed in claim 14, wherein forming the internal capacitor structure comprises forming a capacitor structure using organic materials.

17. The method as claimed in claim 14, wherein forming the internal capacitor structure comprises forming an integrated circuit capacitor.

18. A method for fabricating a capacitor, the method comprising:

fabricating an internal capacitor structure;

forming an extended surface land on a surface of the internal capacitor structure, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein forming the extended surface land comprises forming the extended surface land with the land length being equal to at least 30% of a width of the capacitor; and forming one or more side terminations, which electrically connect the extended surface land to one or more electrodes of the internal capacitor structure.

19. A method for fabricating a capacitor, the method comprising:

fabricating an internal capacitor structure;

forming an extended surface land on a surface of the internal capacitor structure, wherein the extended surface land has a land length that is long enough for two or more vias to be connected to the extended surface land, and the land length is a length of the extended surface land from an edge of the capacitor to an end of the extended surface land, in a direction perpendicular to the edge, and wherein forming the extended surface land comprises forming the extended surface land with the land length being equal to at least 20% of a length of the capacitor; and forming one or more side terminations, which electrically connect the extended surface land to one or more electrodes of the internal capacitor structure.

20. An integrated circuit package comprising:

a capacitor, including:

an internal capacitor structure, and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge; and the two or more vias electrically connected to the extended surface land.

21. The integrated circuit package as claimed in claim 20, wherein the capacitor is embedded within the integrated circuit package.

22. The integrated circuit package as claimed in claim 20, wherein the capacitor is mounted on a surface of the integrated circuit package.

23. An electronic system comprising:

a bus;

a memory coupled to the bus;

an integrated circuit package coupled to the bus, the integrated circuit package including:

a capacitor, including an internal capacitor structure, and an extended surface land, electrically connected to the internal capacitor structure and formed on a surface of the capacitor, wherein the extended surface land has a land length that is long enough for two or more vias to be connected to the extended surface land, and the land length is a length of the extended surface land from an edge of the capacitor to an end of the extended surface land, in a direction perpendicular to the edge, and the two or more vias electrically connected to the extended surface land; and a microprocessor located on a top surface of the integrated circuit package, the microprocessor containing a circuit which is electrically connected to the extended surface land.

24. The electronic system as claimed in claim 23, wherein the capacitor is embedded within the integrated circuit package.

25. The electronic system as claimed in claim 23, wherein the capacitor is mounted on a surface of the integrated circuit package.

26. A capacitor comprising:

an internal capacitor structure; and multiple extended surface lands, electrically connected to the internal capacitor structure and formed on a surface of the capacitor, wherein each extended surface land has a land length that is long enough for two or more vias to be connected to the extended surface land, and the land length is a length of the extended surface land from an edge of the capacitor to an end of the extended surface land, in a direction perpendicular to the edge, and wherein the land length is equal to at least 30% of a width of the capacitor.

27. A capacitor comprising:

an internal capacitor structure; and multiple extended surface lands, electrically connected to the internal capacitor structure and formed on a surface of the capacitor, wherein each extended surface land has a land length that is long enough for two or more vias to be connected to the extended surface land, and the land length is a length of the extended surface land from an edge of the capacitor to an end of the extended surface land, in a direction perpendicular to the edge, and wherein the land length is equal to at least 20% of a length of the capacitor.

28. A method for fabricating a capacitor, the method comprising:

fabricating an internal capacitor structure;

forming multiple extended surface lands on a surface of the internal capacitor structure, wherein each extended surface land has a land length that is long enough for two or more vias to be connected to the extended surface land, and the land length is a length of the extended surface land from an edge of the capacitor to an end of the extended surface land, in a direction perpendicular to the edge, and wherein forming the multiple extended surface lands comprises forming the multiple extended surface lands with the land length being equal to at least 30% of a width of the capacitor; and forming one or more side terminations, which electrically connect the multiple extended surface lands to one or more electrodes of the internal capacitor structure.

29. A method for fabricating a capacitor, the method comprising:

fabricating an internal capacitor structure;

forming multiple extended surface lands on a surface of the internal capacitor structure, wherein each extended surface land has a land length that is long enough for two or more vias to be connected to the extended surface land, and the land length is a length of the extended surface land from an edge of the capacitor to an end of the extended surface land, in a direction perpendicular to the edge, and wherein forming the multiple extended surface lands comprises forming the multiple extended surface lands with the land length being equal to at least 20% of a length of the capacitor; and forming one or more side terminations, which electrically connect the multiple extended surface lands to one or more electrodes of the internal capacitor structure.

* * * * *